(12) United States Patent
Stern et al.

(10) Patent No.: US 6,731,438 B2
(45) Date of Patent: May 4, 2004

(54) ALIGNMENT MARK SYSTEM FOR MASS TRANSPORT PROCESSES

(75) Inventors: Margaret B. Stern, Sudbury, MA (US); Zong Long Liau, Belmont, MA (US)

(73) Assignee: Axsun Technologies, Inc., Billerica, MA (US)

( * ) Notice: Subject to any disclaimer, the term of this patent is extended or adjusted under 35 U.S.C. 154(b) by 87 days.

(21) Appl. No.: 09/725,354

(22) Filed: Nov. 29, 2000

(65) Prior Publication Data

US 2002/0063974 A1 May 30, 2002

(51) Int. Cl.[7] ............................................... G02B 27/02
(52) U.S. Cl. ..................... 359/804; 359/808; 359/811; 250/492.2; 430/22
(58) Field of Search .............................. 359/804, 808, 359/811, 618, 619, 710, 708, 711; 250/492.1, 492.2; 430/22, 30

(56) References Cited

U.S. PATENT DOCUMENTS

| | | | | |
|---|---|---|---|---|
| 4,935,939 A | * | 6/1990 | Liau et al. ..................... | 372/98 |
| 5,674,650 A | * | 10/1997 | Dirksen et al. ............... | 430/22 |
| 5,807,622 A | * | 9/1998 | Liau et al. ................... | 428/156 |
| 5,933,228 A | * | 8/1999 | Taylor et al. ................ | 356/124 |

* cited by examiner

*Primary Examiner*—Huy Mai
(74) *Attorney, Agent, or Firm*—J. Grant Houston

(57) ABSTRACT

A technique for creating alignment feature in mass transported substrates yields alignment features that can be located with high degrees of accuracy. Specifically, structures such as concave or convex lenses are created that yield a light pattern in transmission or reflection when the part of the substrate is imaged or a plane near the substrate is imaged. This light pattern is then used to align the substrate during subsequent lithography or packaging processes.

24 Claims, 6 Drawing Sheets

ALIGNMENT MARK SYSTEM FOR MASS TRANSPORT PROCESSES

BACKGROUND OF THE INVENTION

Alignment marks are a commonly used tool, especially in photolithographic processes. Successive masks used in the patterning of substrate or subsequent layers must be aligned with respect to each other. As a result, it is common to form alignment mark(s) in a substrate or subsequent layer, for example, and then develop that alignment mark. Subsequent lithographic processes can then be aligned to that mark.

Alignment marks can also be used during the subsequent packaging of the semiconductor device. For example, an alignment mark generated in a previous photolithographic process can be used during singulation or by a pick-and-place machine to align the semiconductor device to its package.

SUMMARY OF THE INVENTION

When manufacturing alignment marks, it is generally required that the alignment marks have some feature that can be easily identified and located with a high degree of precision. For example, cross-style alignment marks are a common configuration in which the lines of the cross are precisely formed. Each line of this cross allows the masks to be aligned in one dimension. The lines together thus allow the two dimensional alignment of the mask to the substrate to the precision to which the lines of the cross can be located.

The requirement for precise lines or "hard edges" in typical alignment mark structures is difficult to obtain in a sub-class of photolithographically-based processes in which edges are smoothed in subsequent processing. One of example of such a process is the mass transport process that is used to manufacture small optical structures. Specifically, this technique is described in U.S. Pat. Nos.: 5,807,622 or 5,618,474. The general scheme is to etch structures or mesas in a substrate using reactive ion etching. The width of the mesas is related to a desired contour line of the surface of the element to be produced in that the volume of substrate material relocated from above a predetermined desired contour line is equal to the volume to be filled below the predetermined contour line. The substrate is then baked or heat-treated to relocate substrate material, from adjacent mesas, to fill in voids in the space between mesas to produce a smooth surface on the substrate conforming to the predetermined contour of the surface of the element. These characteristics of the mass transport process make it difficult to manufacture the hard edged alignment features that are associated with common strategies.

The present invention is directed to a technique for creating an alignment feature in mass transported substrates. It yields alignment features that can be located with high degrees of accuracy. Specifically, structures are created that yield a light pattern when the part of the substrate is imaged or a plane near the substrate is imaged. This light pattern is then used to align the substrate during subsequent lithography or packaging processes.

In general, according to one aspect, the invention features a mass transported alignment mark system. This system comprises a substrate that has been subjected to a mass transport process and a lens structure formed on the substrate that yields a light pattern when the substrate or a plane near the substrate is imaged.

Generally, a light pattern above the substrate is useful when alignment is performed with a non-contact mask aligner. Typically, such aligners position the mask near the substrate, typically closer than 200–500 micrometers from the top surface of the substrate. Thus, focal lengths for the inventive lens structures will usually be less than 200–600 micrometers when the depth of the feature below the substrate surface is taken into account. Typically, the deepest point of the lens structures are depressed from the surface of the substrate by 0.25 to 25 micrometers after mass transport.

Typically, the substrate is currently gallium phosphide, although, in other embodiments, silicon substrates, for example, are used.

In the current implementation, the alignment marks are used to align a subsequent metal layer to the light pattern, and thus, the lens structure. This metal layer is used in metal, such as solder or thermo-compression, bonding processes.

In the preferred embodiment, the lens structure that is created is concave. Presently, concave cylindrical lenses are used that have been formed in the substrate. These lens structures focus light preferably near a surface of the substrate in reflection. Thus, when the substrate is viewed with an imaging system, such as a microscope system of a mask aligner, the lens shaped alignment marks appear as bright lines to the imaging system.

In general, according to another aspect, the invention features an alignment mark system that comprises a substrate and a lens structure formed in the substrate that has a focal point in the substrate or near a surface of the substrate.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
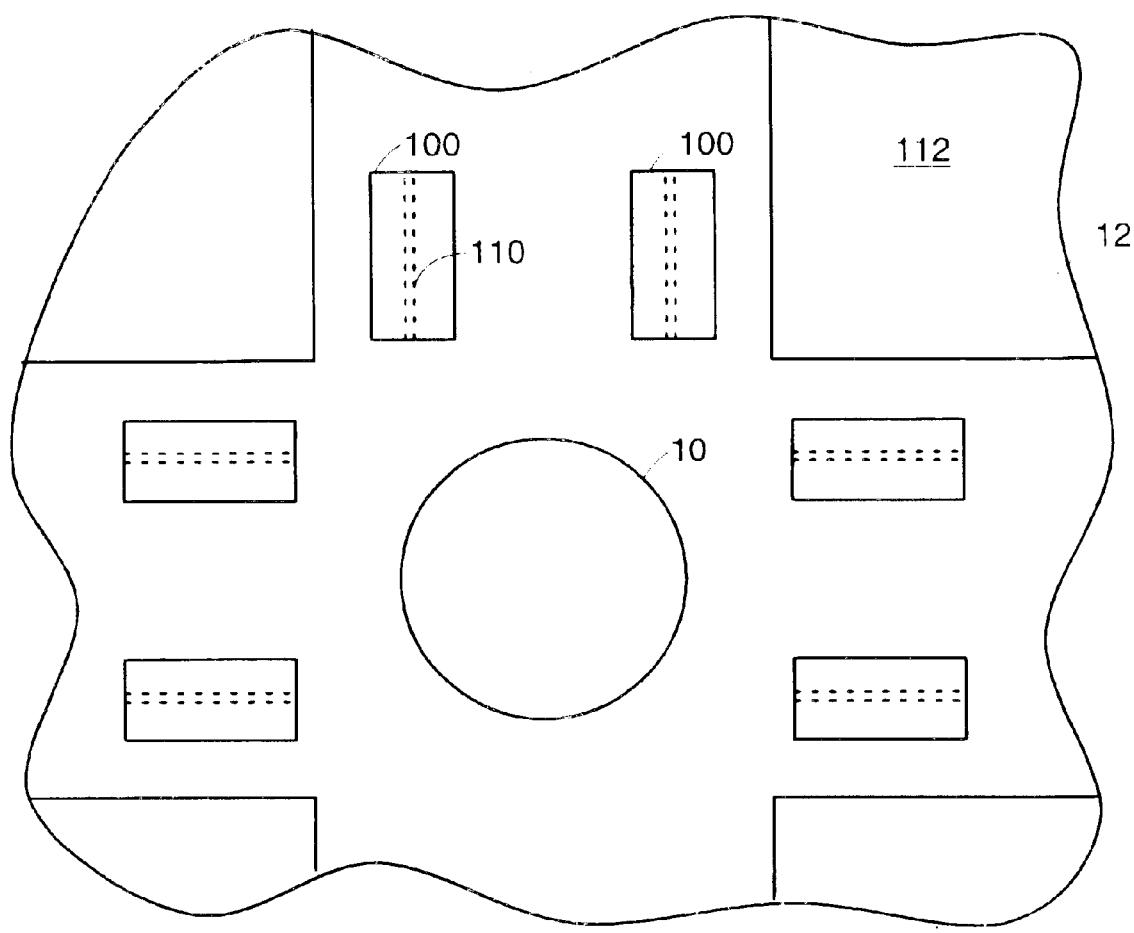
FIG. 1 is schematic plan view of a mass transported substrate showing the lens alignment structures according to the present invention.

FIG. 1 shows a substrate with an optical device formed in the substrate using a mass transport process and lens alignment structures, which have been constructed according to the principles of the present invention.

Specifically, it is known to manufacture a lens 10 on a substrate 12 using a mass transport process as described in, for example, U.S. Pat. Nos.: 5,807,622 or 5,618,474, the teachings of these patents being incorporated herein in their entirety by this reference. Such lenses can be spherical or aspheric, concave or convex lenses. In some implementations, they can be used as refractive optics. In still other implementations, they are coated and used as reflective optics.

According to the invention, alignment lens structures 100 are formed in the substrate 12. These lens alignment structures yield light patterns 110 when, for example, viewed with light that is directed toward to the substrate 112 and orthogonal to a plane of the substrate in one implementation.

In the present implementation, the lens alignment structures produce a bright colored line alignment feature that stretches axially along the alignment structure. From the simple paraxial approximation, the focal length f is related to the mirror radius of curvature Rc (for a light source located at infinity) by $1/f=-2/Rc$. These light patterns are used when mounting the optic or optical device 10 to a mounting structure in one application or, for example, when placing subsequent layers, such as metal layers 112 on the substrate 12 that are used in, for example, bonding processes.

Figure 2:
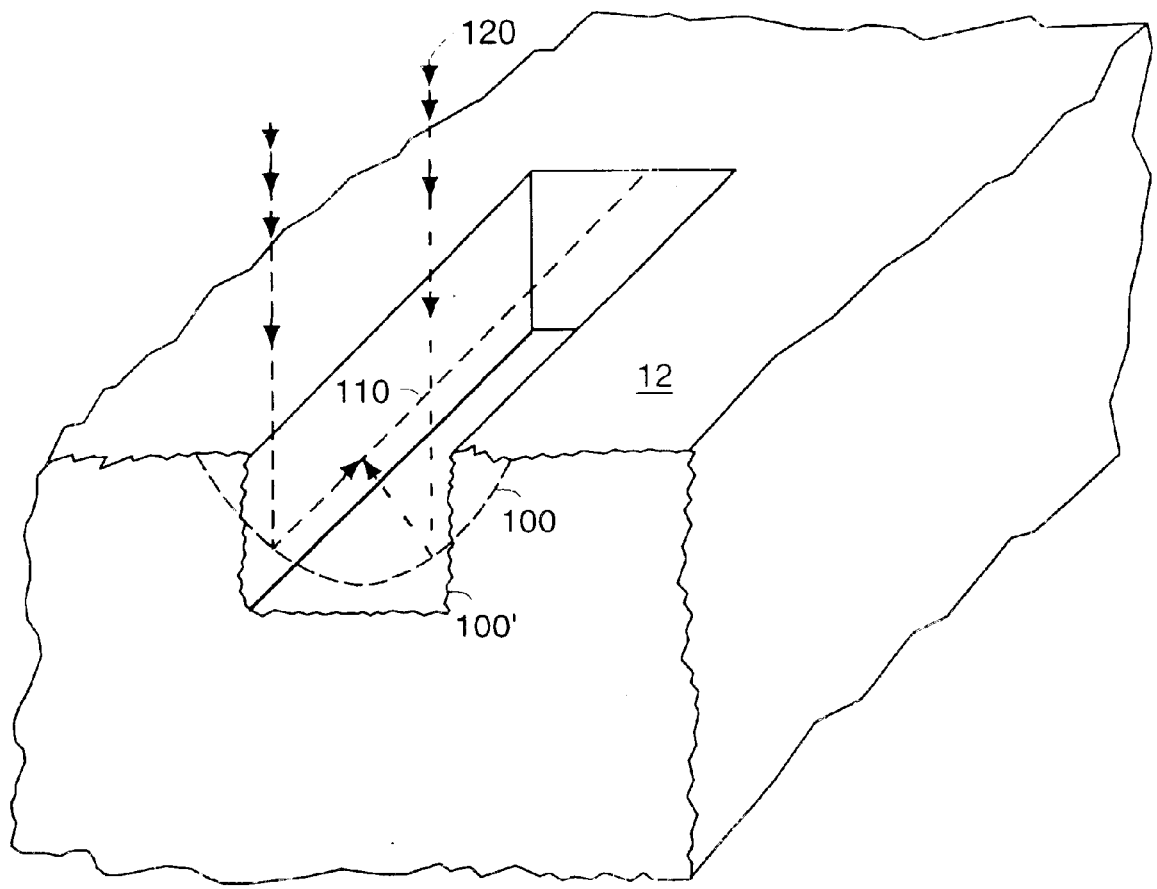
FIG. 2 is a schematic perspective cross-sectional view illustrating the lens alignment structure before and after the mass transport process.

FIG. 2 further illustrates the lens alignment structure before and after mass transportation. Specifically, in the illustrated embodiment, a rectangular blind hole 100' is etched into the substrate 12. Typically, gallium phosphide substrates are used. In other implementations, however, substrates such as silicon are used. Reactive ion etching (RIE) is preferably used, although other anisotropic etching techniques could be used.

The mass transport process is triggered by exposing the substrate 12 to an elevated temperature typically in a controlled atmosphere. It has the effect of smoothing the surface features of the substrate 12 and specifically, those features that have been etched into the substrate. This is commonly used to produce high quality refractive or reflective optics.

In the present invention when the blind hole 100' is mass transported, it yields a lens alignment structure 100, which is concave cylindrical in the present implementation. The depth and width of the blind hole 100' was designed in view of the applied mass transport process parameters to yield a cylindrical lens that has a focal point (110) preferably at or near a plane of the top surface of the substrate 12. Thus, when it is imaged with light rays such as rays 120, and viewed from above, a bright line 110 is created at the focal point.

Figure 3:
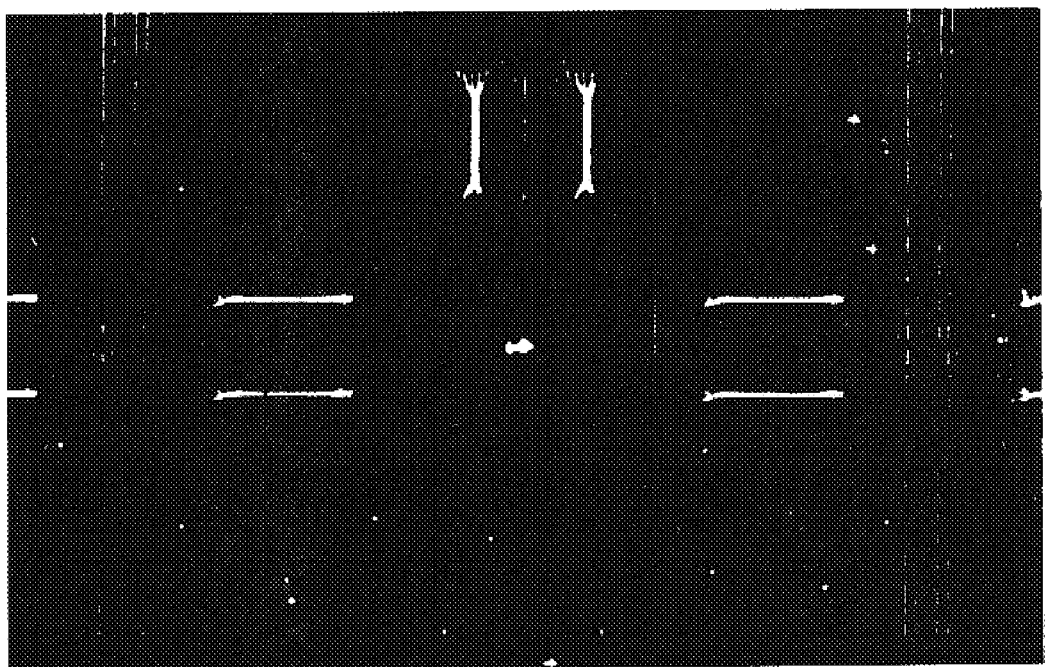
FIG. 3 is an image of the lens alignment structure with the optical devices after the mass transport process.

FIG. 3 is an image illustrating the operation of the lens alignment structures. The lens alignment structure focuses reflected light to form a real image at or near a surface of the substrate. Specifically, the cylindrical lens alignment structures 100 yield a bright line alignment features 110 when illuminated and the imaging system, such as a mask aligner, focuses on a top surface of the substrate 12. These alignment features are used to align a subsequent metal mask 140 in a subsequent photolithographic metal deposition step, in one application. Alternatively, the alignment features are used when installing optic 10 in a carrier or as required for other packaging.

Figure 4:
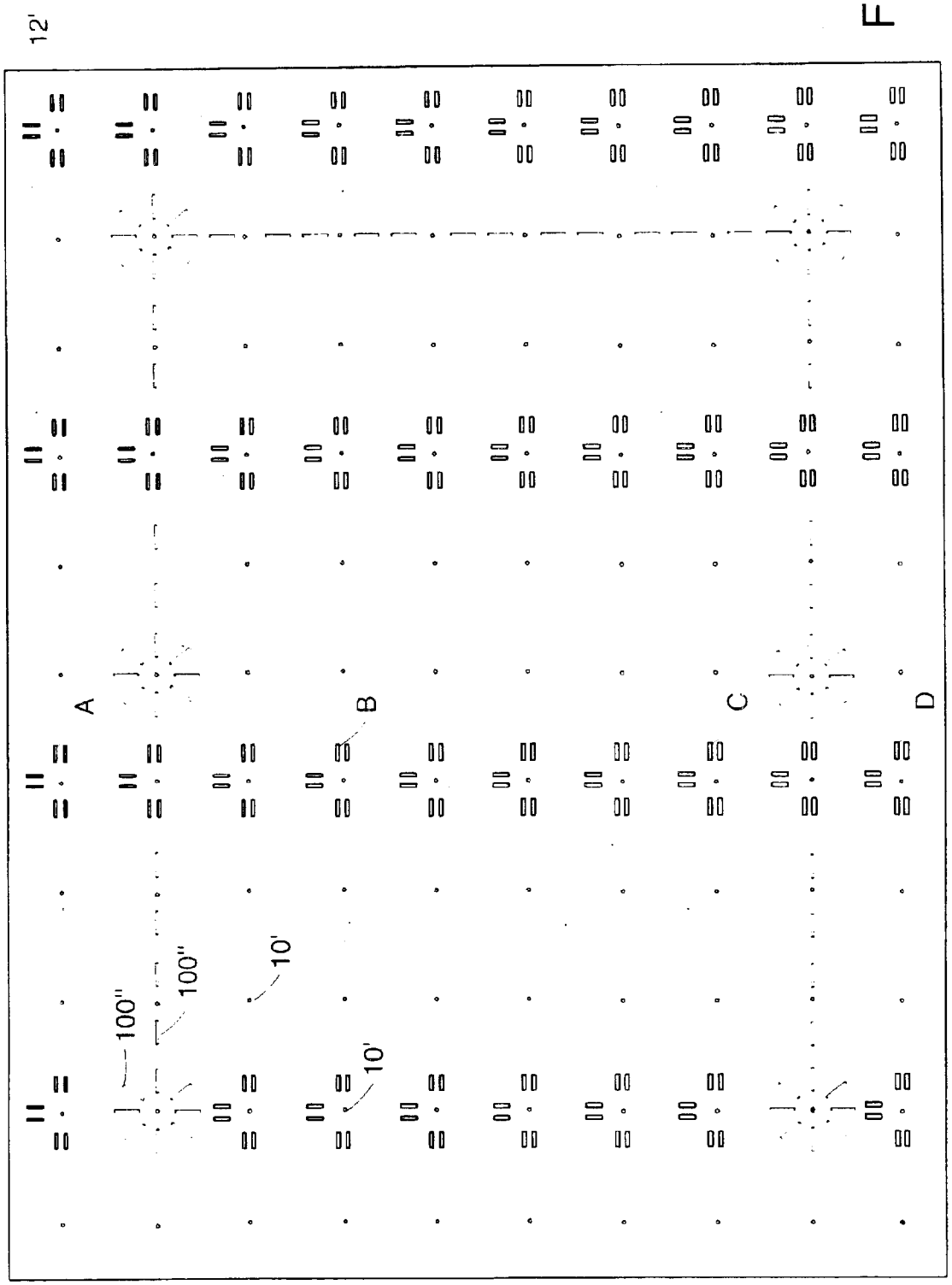
FIG. 4 shows an RIE mask illustrating the position of lens alignment structures on a wafer that are used to manufacture multiple optical devices.

FIG. 4 illustrates an exemplary etch mask that is used when patterning a substrate that will yield multiple optics after a subsequent singulation process. Specifically, mask features that produce multiple lens optic mesa structures 10' are placed throughout the mask. Mask areas 100" are used to define the lens blind holes 100' that will yield the subsequent lens alignment structures after the mass transport process.

Close observation of the etch mask exposes mask blind hole mask features (see A, B, C, D,) of different widths. The resulting lens alignment structures that will be produced from this mask will have a corresponding range of focal length varying from near the surface of the substrate to above the substrate. In one implementation, the lens alignment structures with focal points above the substrate are used when alignment subsequent masks to the substrate.

Typically, when masks are aligned, they are at a different elevation than the substrate surface. The masks can typically only be moved when out-of contact with the substrate. As a result, during the alignment process since the typical alignment feature is not coplanar with the corresponding mask feature, the focus of the mask aligner must be adjusted between the mask and the substrate. This problem is avoided with the present invention since by selecting the focal length to be equal to the height of the mask during subsequent alignment operations, an in-focus alignment feature can be viewed with the mask also being in focus.

Figure 5:
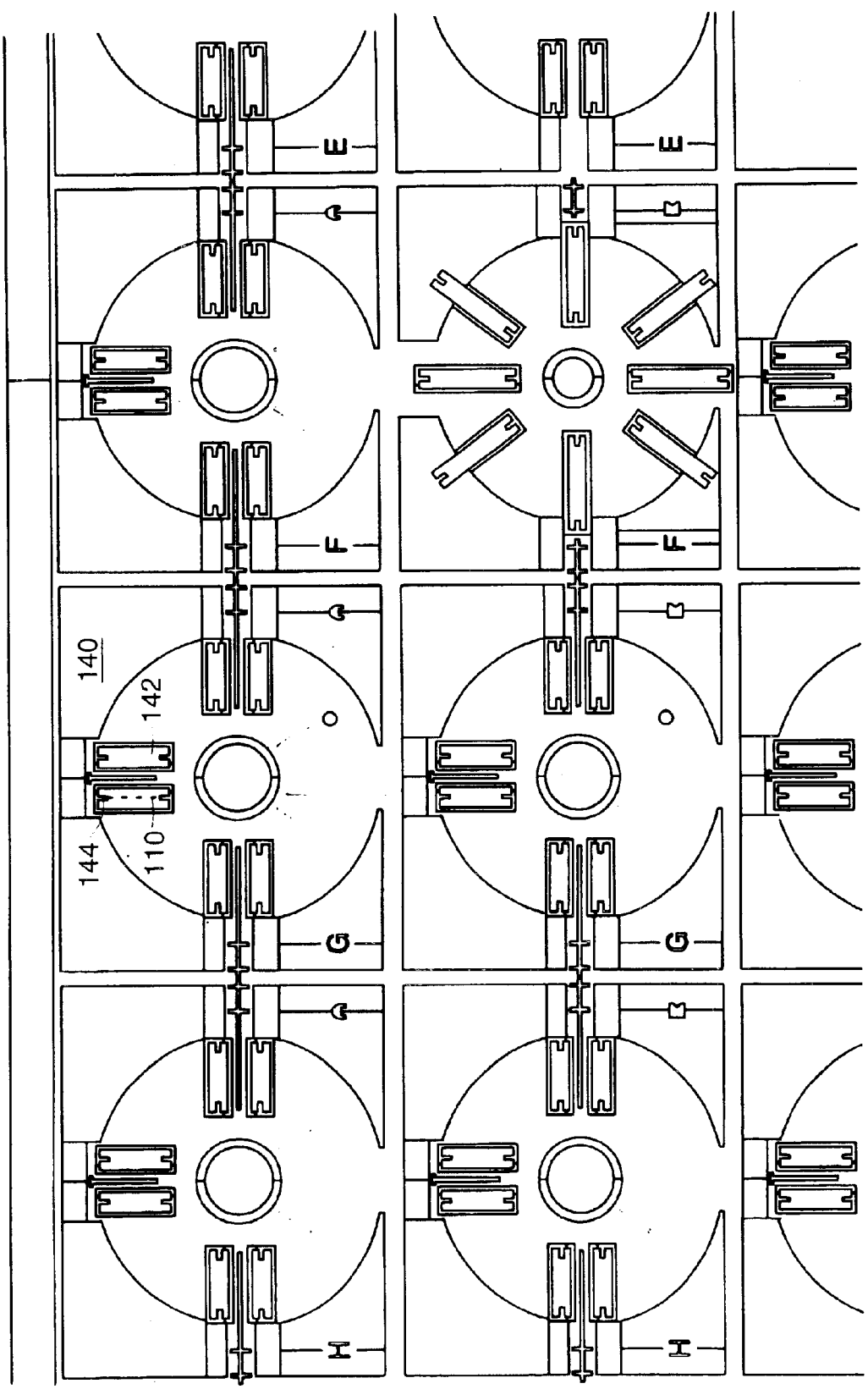
FIG. 5 is a mask layout for a metal layer that is aligned to the substrate using the lens alignment structures of the present invention.

FIG. 5 shows a mask lay-out for a subsequent metalization step. Specifically, the metal mask comprises areas 140 that will be metallized and non-metallized areas 142. The pattern overlays the lens alignment structures.

Mask alignment mark regions 142, however, are provided that allow the mask aligner operator to align the mask alignment features 144 with the bright line that would generated by the lens alignment structures of the substrate when that substrate is imaged during the alignment process.

Figure 6:
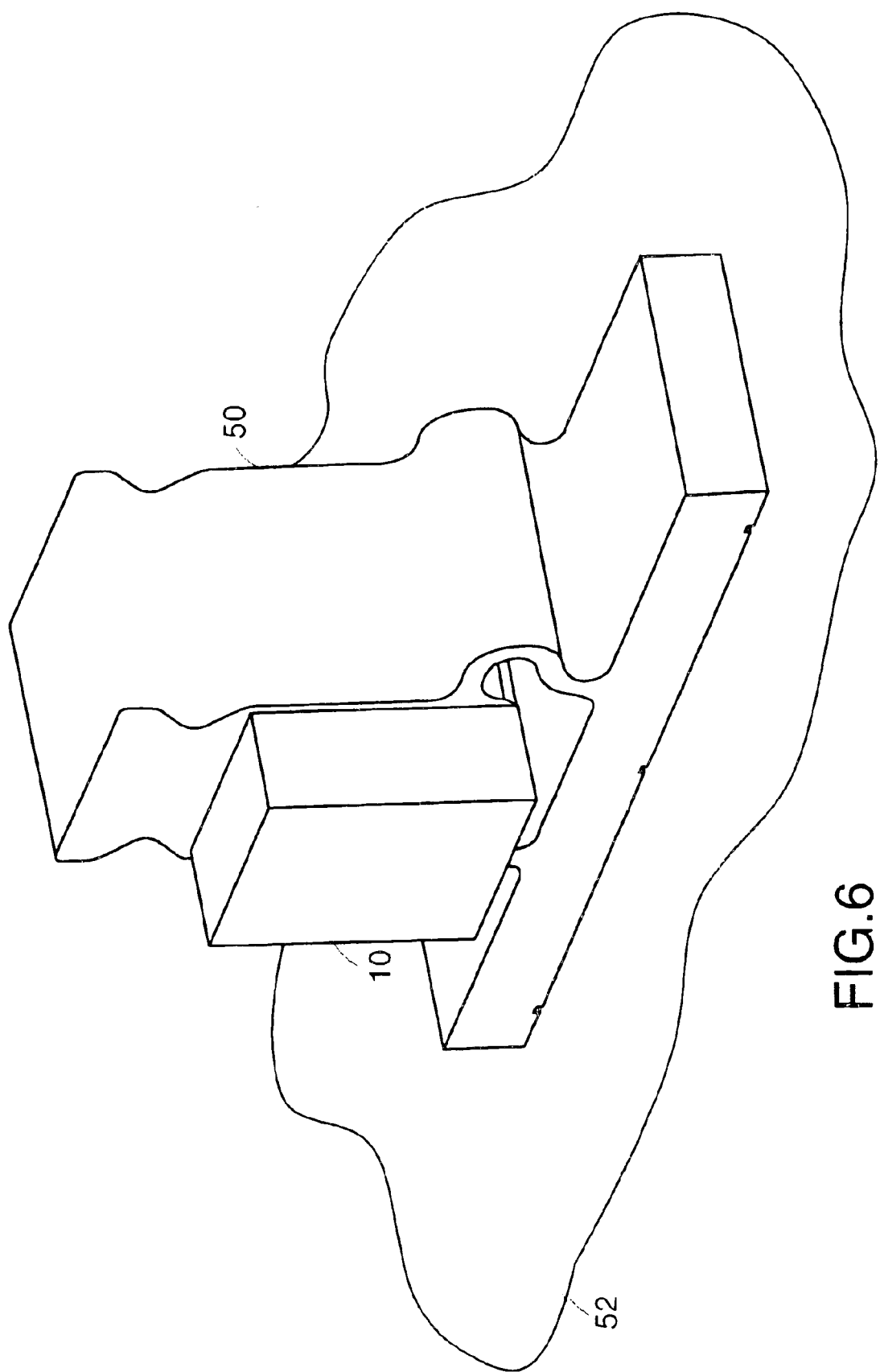
FIG. 6 is a perspective view of a singulated optic attached to a lens mounting structure.

FIG. 6 shows a singulated optic 10 that has been attached to a mounting structure according to one implementation of the invention. Alignment features associated with the metal mask or the lens alignment features are used when positioning and attaching the optic 10 onto the mounting structure 50. Subsequently, this mounting structure 50 with the attached optic 10 is then placed on a micro-optical bench 52 as to yield a free space interconnect optical system in one application.

While this invention has been particularly shown and described with references to preferred embodiments thereof, it will be understood by those skilled in the art that various changes in form and details may be made therein without departing from the scope of the invention encompassed by the appended claims.

For example, in another implementation, a convex transport feature is used to form a real image in transmission near the surface of the substrate. Further, a pillbox structure can be etched into the substrate that mass transported to a spherical mirror that focuses reflected light to form a real image at or near the wafer surface as a "spot" of light. Other shapes can also be formed by forming a shaped preform. As a further example, simple geometrical shapes can be arranged to form a star shaped pattern or to form verniers that line up with features on the overlay mask during the photomask alignment procedure.

Still further, the present invention need not be only applied to mass transport processes. For example, lens features can be produced using the emulsion nature of a photoresist such as a meniscus in a surface of a resist. By selecting the width of the blind hole in which the resist is located on combination with its surface tension, a focal length of a subsequent lens is selected.

What is claimed is:

1. A mass transported alignment mark system, comprising:
   a substrate that has been subjected to a mass transport process; and
   a lens alignment structure formed on the substrate that yields a light pattern when the substrate or a plane near the substrate is imaged;
   a metal layer that is aligned to the light pattern from the lens structure.

2. An alignment mark system as claimed in claim 1, wherein the substrate is gallium phosphide.

3. An alignment mark system as claimed in claim 1, wherein the substrate is silicon.

4. An alignment mark system as claimed in claim 1, wherein the metal layer is used in a metal bonding process.

5. An alignment mark system as claimed in claim 4, wherein the metal layer comprises alignment marks that are used the metal bonding process.

6. An alignment mark system as claimed in claim 1, wherein the metal layer is used in a solder bonding process.

7. An alignment mark system as claimed in claim 6, wherein the metal layer comprises alignment marks that are aligned to the light pattern.

8. An alignment mark system as claimed in claim 1, wherein the lens alignment structure comprises a concave lens.

9. An alignment mark system as claimed in claim 1, wherein the lens alignment structure comprises a cylindrical lens.

10. An alignment mark system as claimed in claim 1, wherein the lens alignment structure comprises a concave cylindrical lens.

11. An alignment mark system as claimed in claim 1, wherein the lens alignment structure comprises multiple concave cylindrical lenses.

12. A mass transported alignment mark system, comprising:
   a substrate that has been subjected to a mass transport process; and
   a lens alignment structure formed on the substrate that yields a light pattern when the substrate or a plane near the substrate is imaged;
   wherein the lens alignment structure comprises multiple concave cylindrical lenses, as least two of the cylindrical lenses being arranged orthogonally with respect to each other.

13. An alignment mark system, comprising:
   a substrate; and
   a lens alignment structure formed in the substrate that has a focal point in the substrate or near a surface of the substrate; and
   a metal layer that is aligned to a light pattern from the lens structure.

14. An alignment system as claimed in claim 13, wherein the substrate is gallium phosphide.

15. An alignment system as claimed in claim 13, wherein the substrate is silicon.

16. An alignment system as claimed in claim 13, wherein the metal layer is used in a metal bonding process.

17. An alignment system as claimed in claim 16, wherein the metal layer comprises alignment marks that are aligned to the an alignment feature generated by the lens alignment structure.

18. An alignment system as claimed in claim 13, wherein the metal layer is used in a solder bonding process.

19. An alignment system as claimed in claim 18, wherein the metal layer comprises alignment marks that are aligned to the an alignment feature generated by the lens alignment structure.

20. An alignment system as claimed in claim 13, wherein the lens alignment structure comprises a concave lens.

21. An alignment system as claimed in claim 13, wherein the lens alignment structure comprises a cylindrical lens.

22. An alignment system as claimed in claim 13, wherein the lens alignment structure comprises a concave cylindrical lens.

23. An alignment system as claimed in claim 13, wherein the lens alignment structure comprises multiple concave cylindrical lenses.

24. An alignment system, comprising:
   a substrate; and
   a lens alignment structure formed in the substrate that has a focal point in the substrate or near a surface of the substrate; and
   wherein the lens alignment structure comprises multiple concave cylindrical lenses, as least two of the cylindrical lenses being arranged orthogonally with respect to each other.

* * * * *